(12) United States Patent
Kim

(10) Patent No.: US 7,436,199 B2
(45) Date of Patent: Oct. 14, 2008

(54) STACK-TYPE SEMICONDUCTOR PACKAGE SOCKETS AND STACK-TYPE SEMICONDUCTOR PACKAGE TEST SYSTEMS

(75) Inventor: Woo-Seop Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/976,128

(22) Filed: Oct. 22, 2007

(65) Prior Publication Data

US 2008/0094086 A1    Apr. 24, 2008

(30) Foreign Application Priority Data

Oct. 24, 2006    (KR) ...................... 10-2006-0103632

(51) Int. Cl.
G01R 31/26 (2006.01)
G01R 31/28 (2006.01)
H01L 23/58 (2006.01)

(52) U.S. Cl. ........................ 324/765; 324/158.1; 257/48

(58) Field of Classification Search ................. 324/765, 324/158.1; 257/48
See application file for complete search history.

(56) References Cited

U.S. PATENT DOCUMENTS

| | | | |
|---|---|---|---|
| 3,492,538 A * | 1/1970 | Fergusson | 361/803 |
| 6,407,566 B1 * | 6/2002 | Brunelle et al. | 324/758 |
| 6,967,397 B2 * | 11/2005 | Inoue et al. | 257/686 |

FOREIGN PATENT DOCUMENTS

| | | |
|---|---|---|
| JP | 2000-304808 A | 11/2000 |
| JP | 2004-271428 | 9/2004 |
| KR | 10-1998-0012659 A | 4/1998 |
| KR | 10-1998-0026775 A | 7/1998 |
| KR | 101998022524 | 7/1998 |
| KR | 10-0417267 B1 | 10/2001 |
| KR | 1020020064060 A | 8/2002 |

OTHER PUBLICATIONS

Notice of Allowability issued on Mar. 31, 2008, for corresponding Korean Patent Application No. 10-2006-0103632.

* cited by examiner

Primary Examiner—Paresh Patel
Assistant Examiner—Karen M Kusumakar
(74) Attorney, Agent, or Firm—Harness, Dickey & Pierce, P.L.C.

(57) ABSTRACT

A stack-type semiconductor package socket may include: a first package connection portion for connection with leads of a lowermost package of a stack-type semiconductor package; a second package connection portion for connection between pads of an odd-numbered package and leads of an even-numbered package, wherein the odd-numbered package and the even-numbered package are adjacent to each other; a lower case for fixing the first package connection portion; and an upper case for fixing the second package connection portion. A stack-type semiconductor package test system may include: a stack-type semiconductor package socket that includes first and second package connection portions; a printed circuit board electrically connected to leads of the lowermost package through the first package connection portion; and a test controller for receiving, outputting, or receiving and outputting signals from, to, or from and to the stack-type semiconductor package through the PCB and the stack-type semiconductor package socket.

23 Claims, 11 Drawing Sheets

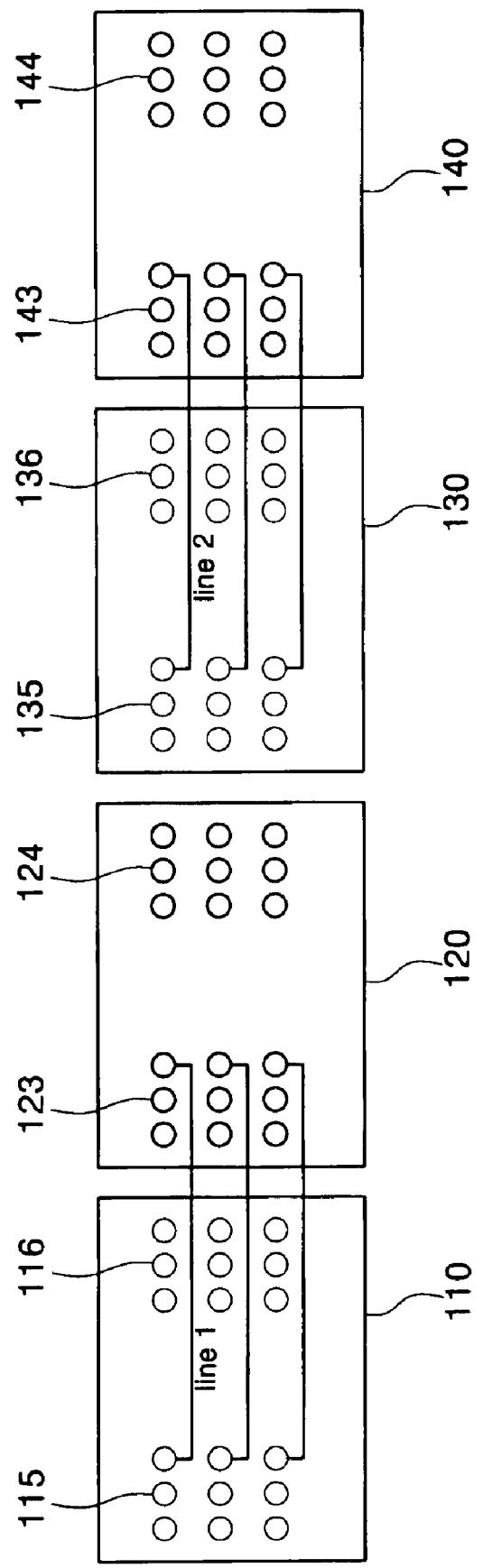

STACK-TYPE SEMICONDUCTOR PACKAGE SOCKETS AND STACK-TYPE SEMICONDUCTOR PACKAGE TEST SYSTEMS

PRIORITY STATEMENT

This application claims priority from Korean Patent Application No. 10-2006-0103632, filed on Oct. 24, 2006, in the Korean Intellectual Property Office (KIPO), the entire contents of which are incorporated herein by reference.

BACKGROUND

1. Field

Example embodiments relate to stack-type semiconductor packages. Also, example embodiments relate to stack-type semiconductor package sockets and/or stack-type semiconductor package test systems.

2. Description of Related Art

As a semiconductor manufacturing technology develops, a semiconductor package with higher integration has been realized. In addition, various electronic devices are pursuing multi-function and miniaturization, which means that the semiconductor packages should be made in smaller sizes while performing more functions.

The size of the existing semiconductor packages greatly depends on the size of a semiconductor chip, and thus the size of the semiconductor package can be reduced by realizing high integration of the semiconductor chip. However, since it is very difficult to reduce the size of the semiconductor chip, there is a limitation to reducing the size of the semiconductor package.

Recently, a multi-chip semiconductor package, in which a plurality of semiconductor chips are packaged in a single semiconductor package, has been introduced. The multi-chip semiconductor package is high in integration of the semiconductor package since a plurality of semiconductor chips are packaged in one semiconductor package and more semiconductor chips can be arranged in the same-sized area. However, the multi-chip semiconductor package has a problem in that the whole semiconductor package can not be used when one of a plurality of semiconductor chips is defective or a wire for connecting the semiconductor chips is defective.

In order to solve the above described problem of the multi-chip semiconductor package, a stack-type semiconductor package has been suggested. The stack-type semiconductor package realizes the small mounting area size and the high integration, such that a plurality of semiconductor packages that respectively comprise one or more semiconductor chips are stacked. The stack-type semiconductor package has a high manufacturing yield since it has a structure in which a plurality of semiconductor packages are stacked and a defective semiconductor package can be separately replaced.

FIG. 1A shows a related art 4-unit stack-type semiconductor package in which four semiconductor packages are stacked.

The semiconductor packages are classified into various types according to the form of their leads, for example, a single inline package (SIP), a dual inline package (DIP), a quad flat package (QFP), and a ball grid array (BGA). Of these, the BGA type semiconductor package is realized by arranging circular ball-shaped leads on a package bottom, and so it has the significantly reduced package size. In addition, the mounting area size of components is reduced since the lead does not protrude out of the side of the package, and it is strong against a noise since the lead has a small ball shape.

Due to such advantages, the BGA type semiconductor package is usually used as the stack-type semiconductor package 1. FIG. 1A shows the BGA type semiconductor package.

A base package 10 is arranged in the lowest layer of the stack-type semiconductor package 1 to be directly connected to a printed circuit board (PCB) 50 or a socket. A plurality of ball-shaped leads 13 are arranged below the base package 10, and a plurality of ball pads 55 are arranged on the PCB 50 or the socket, corresponding to a plurality of leads 13. Each lead 13 of the base package 10 is electrically connected to the corresponding ball pad 55 of the PCB 50 or the socket to transmit a signal.

A plurality of pads 15 are arranged on the base package 10 for electrically connection with a stack package 20 that is to be arranged above the base package 10. A plurality of pads 15 of the base package 10 are configured in a pattern corresponding to leads 23 of the stack package 20.

The base package 10 further comprises a repeater 11. The repeater 11 transmits various signals such as an address, data, and a command that are applied through the PCB 50 or the socket to the base package 10 when the signals are for the base package 10, but does not transmit the signals to the stack packages 20 to 40. But the repeater 11 transmits the signals to the stack packages 20 when the signals applied through the PCB 50 or the socket are for the stack packages 20 to 40.

As shown in FIG. 1A, three stack packages 20 to 40 are stacked above the base package 10. The stack packages 20 and 30 comprise repeaters 21 and 31, ball-shaped leads 23 and 33, and pads 25 and 35, similarly to the base package 10.

The leads 23 and 33 of the stack packages 20 and 30 are smaller in number than those of the base package 10. That is, the base package 10 receives/outputs all signals received/outputted to/from the stack packages 20 and 30 as well as itself from/to the PCB 50 and, thus it has a large number of leads. However, the stack package 20 does not need to receive/output signals for the base package 10, and the stack package 40 receives/outputs only signals for itself. The stack packages 20 and 30 comprise pads 25 and 35 corresponding to the leads 33 and 43 of the stack packages 30 and 40, respectively. The stack packages 20 and 30 comprise repeaters 21 and 31 to determine whether signals are inputted/outputted to/from the stack packages 30 and 40. In FIG. 1A, the repeaters 11 to 31 are shown as discrete devices in the base package 10 and the stack packages 20 and 30, but it is for the convenience of explanation, and they are a part of the semiconductor chips in the package.

The stack package 40 is arranged at the highest layer of the stack-type semiconductor package 1, and so it does not need to transmit data upwardly. The stack package 40 comprises leads 43 for electrical connection with the stack package 30, but it does not need a pad or a repeater. However, it may comprise a pad and a repeater for a case where a function of the stack-type semiconductor package 1 is extended, so that a stack package is added above the stack package 40.

FIG. 1B is an exploded view illustrating individual packages of the related art stack-type semiconductor package of FIG. 1A. FIG. 1B shows the base package 10 and the stack package 20 as part of the stack-type semiconductor package 1 of FIG. 1A. In FIG. 1A, the leads 13 to 43 and the pads 15 to 35 are not classified into input ones and output ones, but for the convenience of explanation, in FIG. 1B, the leads are classified into input leads 13 and 23 and output leads 14 and 24, and the pads are classified into input pads 16 and 26 and output pads 15 and 25.

Let us assume that the stack-type semiconductor package 1 is a semiconductor memory device. An input signal in_sig such as an address, data, and a command is applied from an external memory controller, and it is then inputted to a plurality of input leads 13 of the base package 10 through the PCB 50. The base package 10 analyzes the input signal in_sig and performs a corresponding operation to the input signal in_sig when it is a signal for the base package 10. When a read command and an address are applied as the input signal in_sig and the address is for the base package 10, the repeater 11 does not transmit the input signal in_sig to the stack package 20, and the base package 10 outputs data of the corresponding address as an output signal out_sig through the output leads 14.

However, when the input signal in_sig is not a signal for the base package 10, the repeater 11 outputs the input signal in_sig to the output pads 15. The input signals in_sig outputted to the output pads 15 are applied to the stack package 20 through the input leads 23 of the stack package 20 that are electrically connected to the output pads 15. Like the repeater 11 of the base package 10, the repeater 21 of the stack package 20 analyzes the input signal in_sig to determine whether it is a signal for the stack package 20 or not. The repeater 21 performs a corresponding operation when the input signal in_sig is a signal for the stack package 20. However, when it is not a signal for the stack package 20, the repeater 21 outputs it through the output pads 25 again. When a read command and an address are applied as the input signal in_sig and the address is for the stack package 20, the stack package 20 outputs data of the corresponding address through the output leads 24. If data is applied to the base package 10 through the input pads 16 of the base package 10, that are electrically connected to the output leads 24 of the stack package 20, the repeater 11 of the base package 10 externally outputs transmitted data as the output signal out_sig through the output leads 14.

FIG. 1C is a timing diagram illustrating an operation of the related art stack-type semiconductor package of FIG. 1B. In FIG. 1C, an input signal in_sig1 is a signal for the base package 10, and an input signal in_sig2 is a signal for the stack package 20.

Since the input signal in_sig2 is a signal for the stack package 20, the repeater 11 of the base package 10 analyzes it and then applies it to the stack package 20. Thus, the input signal in_sig2 is delayed by a predetermined time and then is inputted to the stack package 20. The stack package 20 outputs data as the output signal out_sig after a column latency (CL) in response to a read command of the input signal in_sig2. However, since the input signal in_sig1 is a signal for the base package 10, there is little delay. Thus, the base package 10 receives the input signal in_sig1 rapidly compared to the stack package 20. In this instance, an output timing of the output signal out_sig outputted according to the input signals in_sig1 and in_sig2 becomes different. When the input signal in_sig1 is applied to compensate such a timing error of the output signal out_sig, the base package 10 delays it by a repeater delay and then performs a predetermined operation.

FIG. 2 shows a related art stack-type semiconductor package socket.

A test of the stack-type semiconductor package is classified into an individual package test for respectively testing the base package 10 and the stack packages 20 to 40 and a stack-type semiconductor package test for testing all packages stacked. The individual package test is to determine whether each of the base package 10 and the stack packages 20 to 40 is defective or not, and the stack-type semiconductor package test is to determine whether the whole stack-type semiconductor package 1 operates normally or not. Both test equipment for the individual package test and test equipment for the stack-type semiconductor package test have a socket. The socket of FIG. 2 is one example of the test equipment for the stack-type semiconductor package test, and FIG. 2 shows that the stack-type semiconductor package 1 is inserted into the socket.

The socket of FIG. 2 is explained below with reference to FIG. 1A. The socket comprises a package connection portion 70 that is electrically connected to the lead 13 of the stack-type semiconductor package 1 to be inserted for transmits a signal between the PCB 50 and the stack-type semiconductor package 1. The socket further comprises a lower case 63 for fixing the package connection portion 70 and a socket fixing means 69 for fixing the package connection portion 70 and the lower case 63 to the PCB 50. Here, a screw may be used as the socket fixing means 69. The sock et further comprises an upper case 65 and an upper case fixing means 67. The upper case 65 is arranged above the stack-type semiconductor package 1, and the lower and upper cases 63 and 65 are fixed by the upper case fixing means 67. At this time, pressure is applied to the stack-type semiconductor package 1, so that the stack-type semiconductor package 1 and the package connection portion 70 are electrically connected. The package connection portion 70 comprises a plurality of connection terminals which respectively correspond to a plurality of leads 13 of the base package 10. A plurality of connection terminals electrically connect corresponding leads 13, respectively, to transmit a signal between the PCB 50 and the corresponding leads 13 when the stack-type semiconductor package 1 is inserted into the socket.

FIG. 2 shows the stack-type semiconductor package socket, but the individual package socket has a similar configuration to that of FIG. 2, except that the individual packages are inserted instead of the stack-type semiconductor package 1. Also, the test equipment has a plurality of sockets in order to test a plurality of individual packages or a plurality of stack-type semiconductor packages. In this instance, it is not efficient that each package is inserted into each socket and the upper case is fixed. For this reason, the test equipment may have a handler for applying predetermined pressure when a plurality of individual packages or a plurality of stack-type semiconductor packages are inserted. Even when the handler is used, the package connection portion 70 should be fixed to the PCB 50.

FIGS. 3A and 3B are photographs illustrating examples of the package connection portion of the related art stack-type semiconductor package socket of FIG. 2. As the connection terminals of the package connection portion 70 of the socket for the stack-type semiconductor package of FIGS. 1A and 1B, such as the BGA type semiconductor package, a connection terminal using a pogo pin or a pressure conductive rubber (PCR) terminal is usually used.

FIG. 3A shows the connection terminal using the pogo pin. The package connection portion 70 comprises a plurality of pogo pins 71. The pogo pin 71 has a structure that upper and lower portions are divided, an elastic member such as a spring is arranged thereinside, and the upper and lower portions electrically connect to each other when predetermined pressure is applied. FIG. 3B shows the connection terminal using the PCR. The connection terminal of FIG. 3B comprises a plurality of PCR terminals 72 that have electrical conductivity and an elastic force when pressure is applied, and an insulator that insulates a plurality of PCR terminals from each other. As the connection terminal of the package connection portion 70, the pogo pin 71 of FIG. 3A and the PCR terminal 72 of FIG. 3B transmit a signal between the stack-type semiconductor package 1 and the PCB 50 when predetermined pressure is applied.

In case of testing the stack-type semiconductor package using the stack-type semiconductor package socket or the handler, both the individual package test and the stack-type semiconductor package test use only the lower leads. That is, in case of the individual package test, the test is performed such that a signal is inputted/outputted to/from the individual package by using the lower leads, and in case of the stack-type semiconductor package test, the test is performed by using only the leads of the base package.

However, in case of the individual package test, a test for a function of the repeater is insufficient. In case of the stack-type semiconductor package test, all functions including a function of the repeater can be tested, but when a defect occurs, the whole stack-type semiconductor package can not be used or the individual semiconductor packages stacked should be disassembled and reassembled, leading to an increment of repairing cost and time. In addition, it is very difficult to find out which package has a problem in the stack-type semiconductor package.

SUMMARY

Example embodiments may provide stack-type semiconductor package sockets in which individual packages of the stack-type semiconductor package, that are not actually stacked, may be tested in a similar environment as the stacked state.

Example embodiments may provide stack-type semiconductor package test systems in which individual packages of the stack-type semiconductor package, that are not actually stacked, may be tested in a similar environment as the stacked state.

According to example embodiments, a stack-type semiconductor package socket may include: a first package connection portion for connection with a plurality of leads of a lowermost package of a stack-type semiconductor package; a second package connection portion for connection between a plurality of pads of an odd-numbered package and a plurality of leads of an even-numbered package, wherein the odd-numbered package and the even-numbered package are adjacent to each other; a lower case for fixing the first package connection portion; and/or an upper case for fixing the second package connection portion.

According to example embodiments, a stack-type semiconductor package test system may include: a stack-type semiconductor package socket that includes a first package connection portion for connection with a plurality of leads of a lowermost package of a stack-type semiconductor package and/or a second package connection portion for connection between a plurality of pads of an odd-numbered package and a plurality of leads of an even-numbered package, wherein the odd-numbered package and the even-numbered package are adjacent to each other; a printed circuit board (PCB) electrically connected to the plurality of leads of the lowermost package through the first package connection portion; and/or a test controller for receiving, outputting, or receiving and outputting various signals from, to, or from and to the stack-type semiconductor package through the PCB and the stack-type semiconductor package socket in order to test the stack-type semiconductor package.

BRIEF DESCRIPTION OF THE DRAWINGS

The above and/or other aspects and advantages will become more apparent and more readily appreciated from the following detailed description of example embodiments taken in conjunction with the accompanying drawings, in which:

FIGS. 6A and 6B show a four-unit stack-type semiconductor package according to example embodiments.

DETAILED DESCRIPTION OF EXAMPLE EMBODIMENTS

Figure 1A:
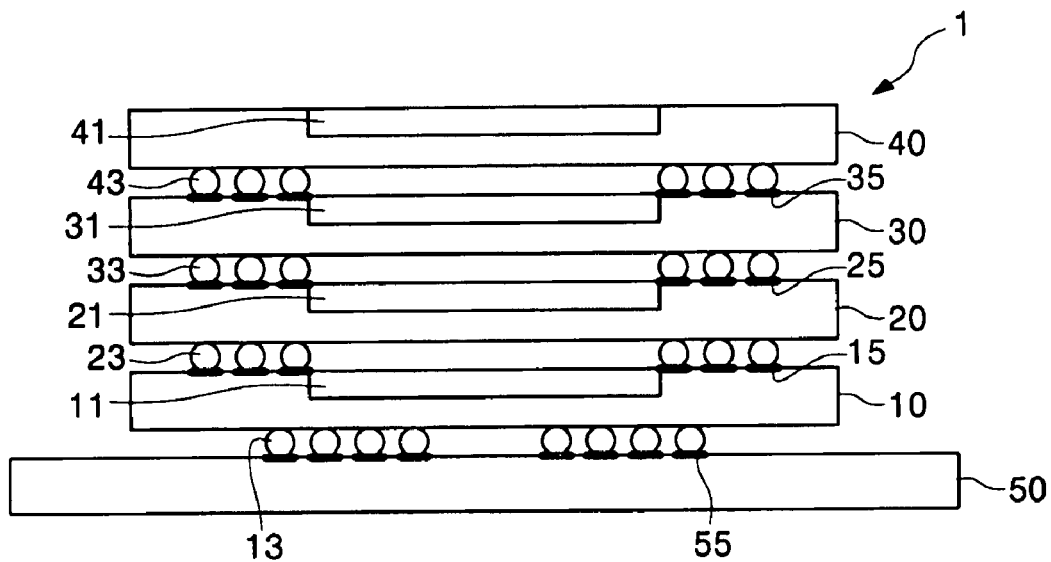
FIG. 1A shows a related art 4-unit stack-type semiconductor package in which four semiconductor packages are stacked.

Example embodiments will now be described more fully with reference to the accompanying drawings. Embodiments, however, may be embodied in many different forms and should not be construed as being limited to the example embodiments set forth herein. Rather, these example embodiments are provided so that this disclosure will be thorough and complete, and will fully convey the scope to those skilled in the art. In the drawings, the thickness of layers and regions may be exaggerated for clarity.

It will be understood that when an element is referred to as being "on, " "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

The stack-type semiconductor package may increase integration of semiconductor packages by stacking a plurality of packages. The stack-type semiconductor packages may be made by connecting a plurality of packages, and such connection may be realized such that an upper pad of the lower package may be electrically connected to a lower lead of the upper package. Thus, even though the upper pad of the lower package may not be physically connected to the lower lead of the upper package, if they are connected by a conductive line so that they can be electrically connected, a plurality of packages may perform the same or similar function(s) as the stack-type semiconductor package in which a plurality of packages may be stacked.

That is, even though individual packages of the stack-type semiconductor package may not be stacked, but may be separately arranged, it may be determined, by electrically connecting the upper pad of the lower package and the lower lead of the upper package, whether the stack-type semiconductor package operates normally or not.

Figure 1B:
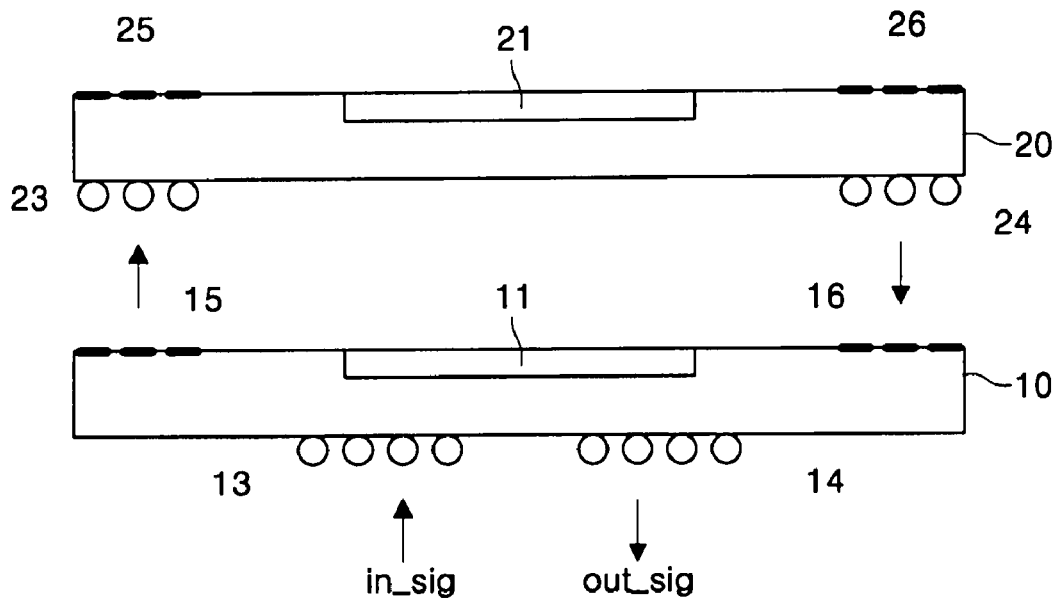
FIG. 1B is an exploded view illustrating individual packages of the related art stack-type semiconductor package of FIG. 1A.
Figure 1C:
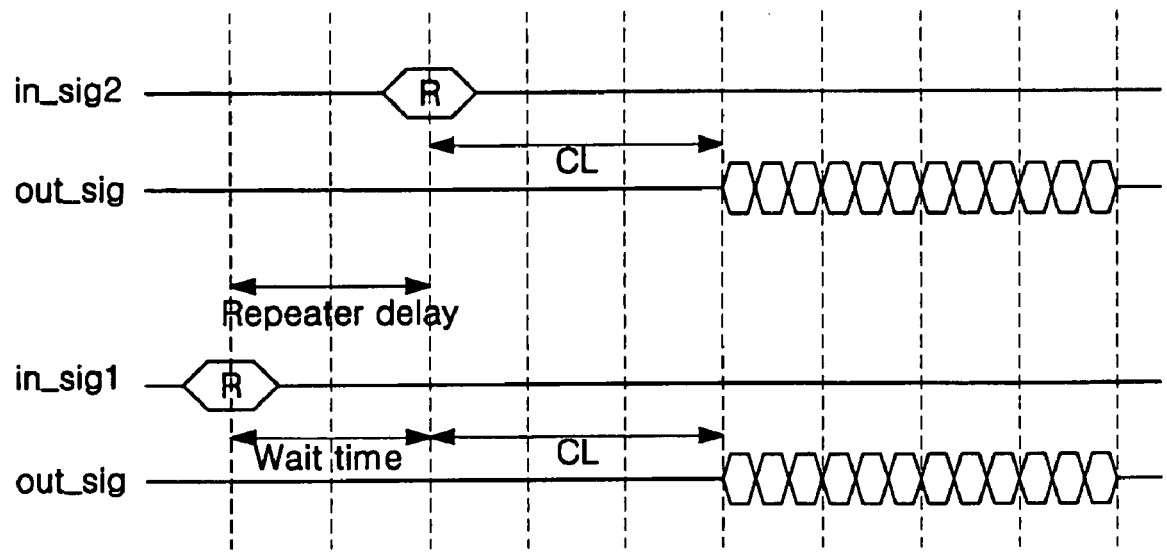
FIG. 1C is a timing diagram illustrating an operation of the related art stack-type semiconductor package of FIG. 1B.
Figure 4:
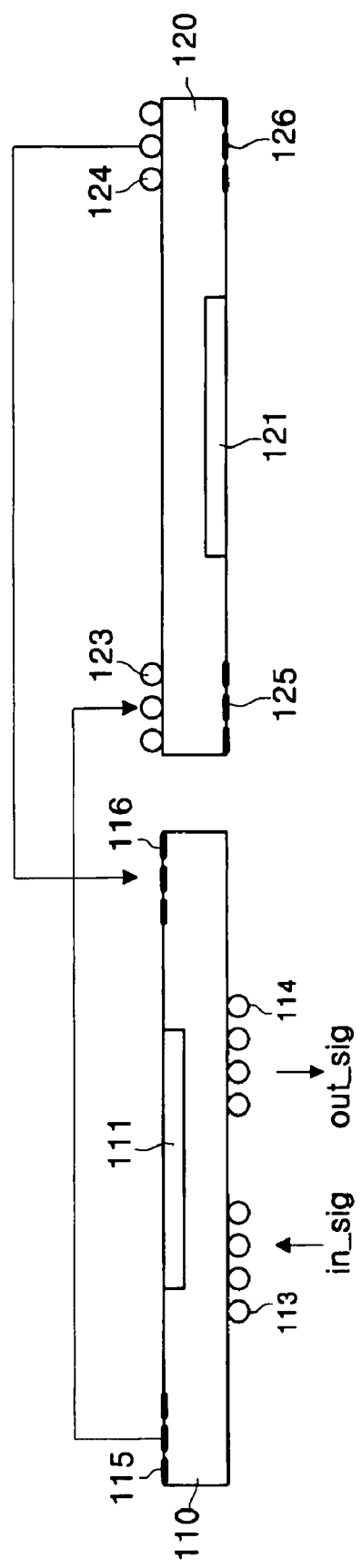
FIG. 4 shows an arrangement of individual packages of a stack-type semiconductor package for a stack-type semiconductor package socket according to example embodiments.

FIG. 4 shows an arrangement of individual packages of a stack-type semiconductor package for a stack-type semiconductor package socket according to example embodiments. Similar to FIG. 1B, a base package 110 and one stack package 120 are shown in FIG. 4.

In the base package 110, input leads 113 and/or output leads 114 may be arranged to look downwards, and/or input pads 116 and/or output pads 115 may be arranged to look upwards. Such an arrangement may be, for example, similar or identical to that of the base package 10 of FIG. 1B. On the other hand, in the stack package 120, input leads 123 and/or output leads 124 may be arranged to look upwards, and/or input pads 126 and/or output pads 125 may be arranged to look downwards. That is, the arrangement of the stack package 120 may be, for example, similar or identical to an overturned arrangement of the stack package 20 of FIG. 1B. The stack package 120 may not be arranged on the base package 110, but it may be arranged, for example, substantially in parallel to the base package 110.

In FIG. 4, all of the input pads 116 and/or output pads 115 of the base package 110 and/or the input leads 123 and/or the output leads 124 of the stack package 120 may be arranged to look upwards. A plurality of output pads 115 of the base package 110 may be electrically connected to a plurality of input leads 123 of the stack package 120 using electrical lines. Similarly, a plurality of input pads 116 of the base package 110 may be electrically connected to a plurality of output leads 124 of the stack package 120 using electrical lines. A conductive wire, such as electric wire, may be used as the electrical line, and/or the electrical line may be selected in consideration of an operational speed of the semiconductor device, since signal distortion may occur due to a noise generated in the electrical line in the case of a high speed semiconductor device.

Even though the base package 110 and/or the stack package 120 may be arranged as shown in FIG. 4, since a plurality of input pads 116 of the base package 110 may be electrically connected to a plurality of output leads 124 of the stack package 120 and/or a plurality of output pads 115 of the base package 110 may be electrically connected to a plurality of input leads 123 of the stack package 120, the base package 110 and the stack package 120 may have a similar environment to the stacked state.

Figure 2:
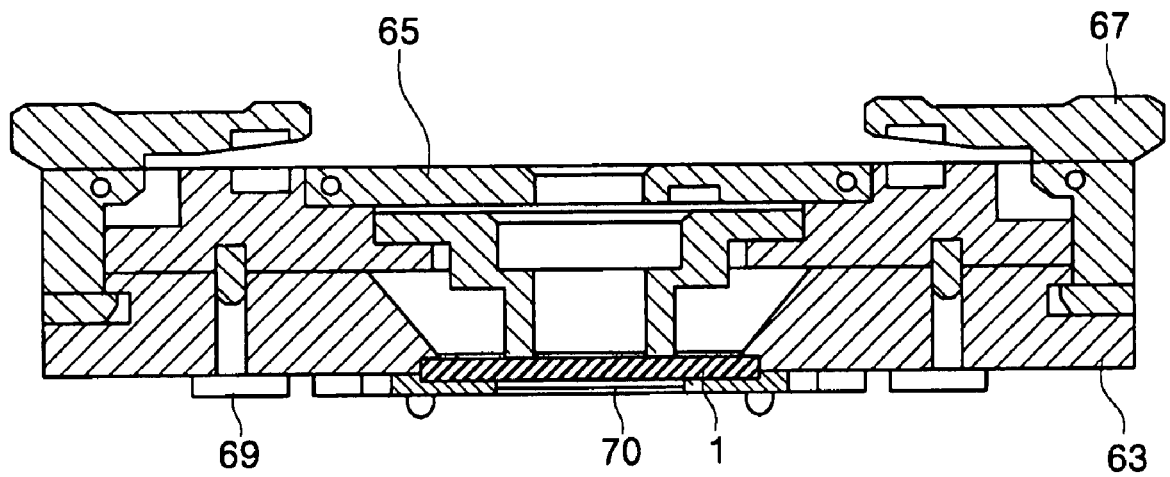
FIG. 2 shows a related art stack-type semiconductor package socket.
Figure 3A:
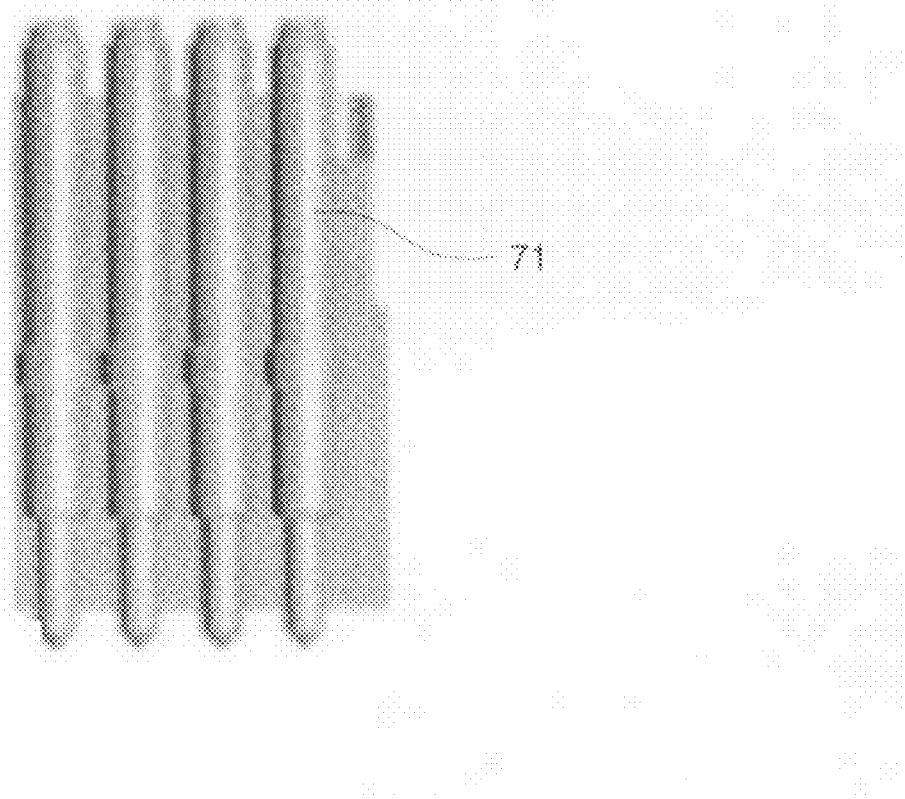
FIGS. 3A and 3B are photographs illustrating examples of a package connection portion of the related art stack-type semiconductor package socket of FIG. 2.
Figure 3B:
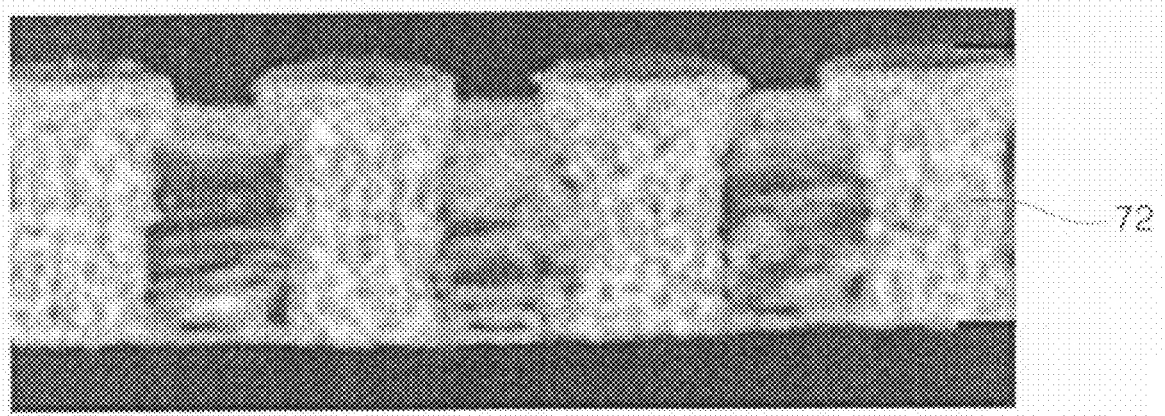
Figure 5A:
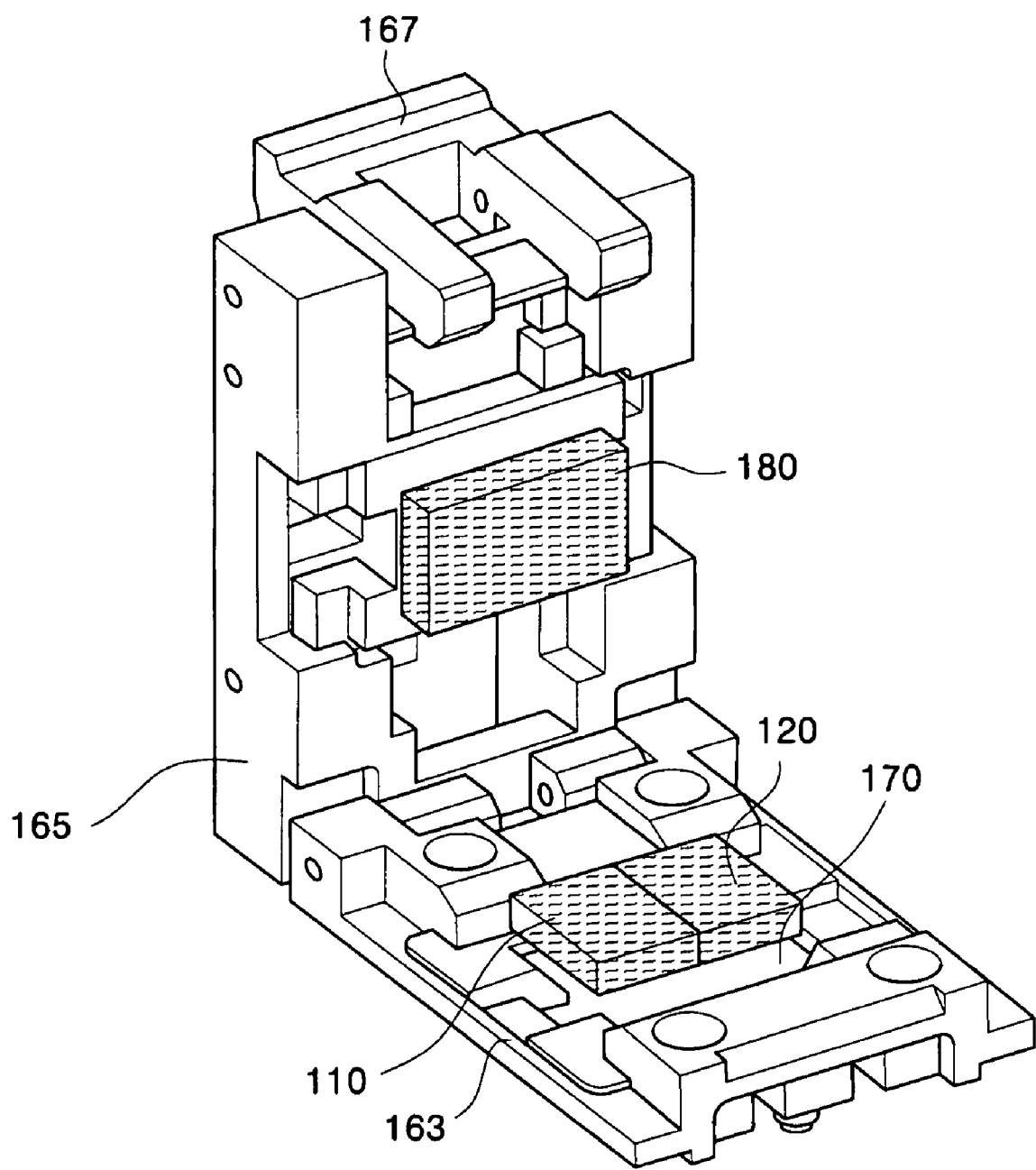
FIG. 5A is a perspective view illustrating the stack-type semiconductor package socket according to example embodiments.

FIG. 5A is a perspective view illustrating a stack-type semiconductor package socket according to example embodiments. The stack-type semiconductor package socket of example embodiments may have a similar configuration to the related art stack-type semiconductor package socket of FIG. 2. The stack-type semiconductor package socket of example embodiments may comprise a lower case 163, an upper case 165, an upper case fixing means 167, a first package connection portion 170, and/or a second package connection portion 180. The lower case 163, the upper case 165, and/or the upper case fixing means 167 of FIG. 5A may be similar or identical to those of FIG. 2. FIG. 5A shows a socket for a two-unit stack-type semiconductor package, and the base package 110 and/or the stack package 120 may be arranged on the first package connection portion 170.

In the two-unit stack-type semiconductor package, the base package 110 may have upper pads, but the pads of the stack package 120 may not be needed. Thus, the first package connection portion 170 may have only connection terminals that may be connected to those of the base package 110. However, for extension of the two-unit stack-type semiconductor package, the first package connection portion 170 may further have connection terminals on an area in which the stack package 120 may be arranged. That is, since the stack-type semiconductor package is inserted into the socket in a state that the leads 123 and/or 124 of the stack package 120 may be arranged to look upwards and/or the pads 125 and/or 126 may be arranged to look downwards, the connection terminals of the first package connection portion 170 may be electrically connected to the pads 125 and/or 126 of the stack package 120.

The second package connection portion 180 may electrically connect the pads 115, 116 of the base package 110 and/or the leads 123, 124 of the stack package 120 and/or may comprise connection terminals, similarly to the first package connection portion 170. The second package connection portion 180 may comprise an electrical connection means, such as a micro-strip line, for internally connecting the connection terminals for the base package 110 and/or the connection terminals for the stack packages 120. The second package connection portion 180 may electrically connect a plurality of output pads 115 of the base package 110 to a plurality of input leads 123 of the stack package 120, and/or may electrically connect a plurality of input pads 116 of the base package 110 to a plurality of output leads 124 of the stack package 120.

Figure 5B:
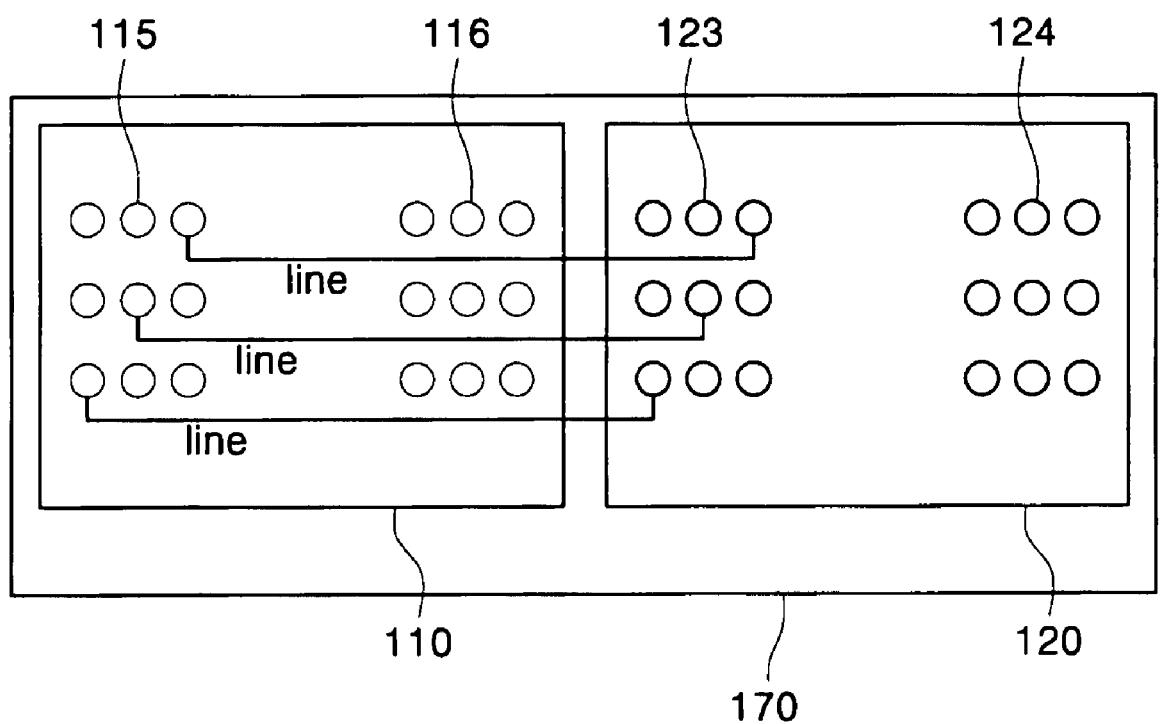
FIG. 5B is a schematic view illustrating an arrangement of individual packages on the stack-type semiconductor package socket of FIG. 5A.
Figure 5C:
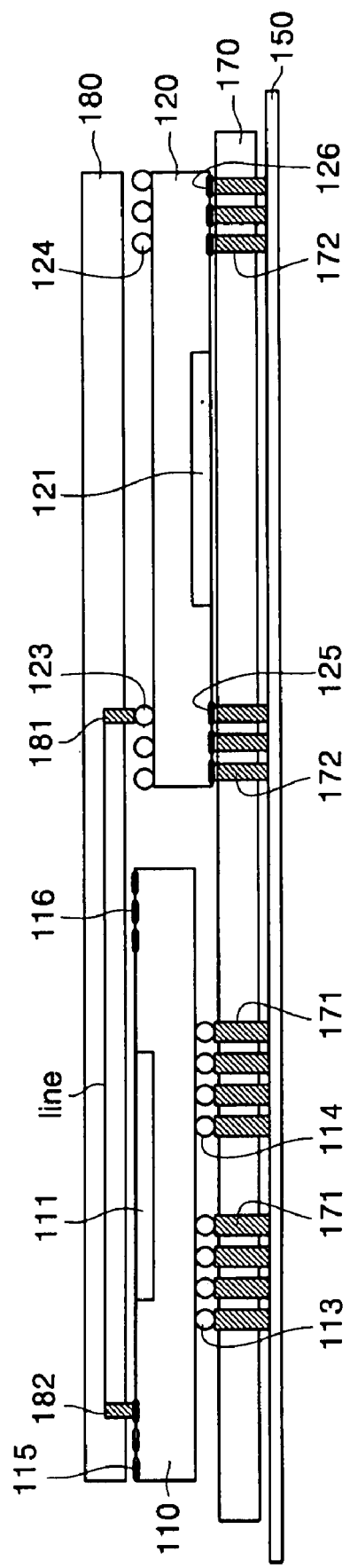
FIG. 5C is a cross-sectional view illustrating the arrangement of the individual packages on the stack-type semiconductor package socket of FIG. 5A.

FIG. 5B is a schematic view illustrating an arrangement of individual packages on the stack-type semiconductor package socket of FIG. 5A, and FIG. 5C is a cross-sectional view illustrating the arrangement of the individual packages on the stack-type semiconductor package socket of FIG. 5A.

FIGS. 5B and 5C show the base package 110 and the stack package 120 inserted into the socket and the first and second package connection portions 170 and 180. The input and output pads 116 and 115 of the base package 110 may be arranged to look upwards, and/or the input and output leads 123 and 124 of the stack package 120 may be arranged to look upwards.

The first package connection portion 170 may comprise lead connection terminals 171 that may be electrically connected to the input and output leads 113 and 114 of the base package 110 and/or pad connection terminals 172 that may be electrically connected to the input and output pads 126 and 125 of the stack package 120. In the two-unit stack-type semiconductor package, if the stack package 120 does not have pads, there may be no need for the pad connection terminals 172. The lead connection terminals 171 and/or the pad connection terminals 172 of the first package connection portion 170 may be electrically connected to the PCB 150 arranged below the first package connection portion 170.

The second package connection portion 180 may be fixed to the upper case 165 of the stack-type semiconductor package socket, and/or may be located above the base package 110 and/or the stack package 120 to pressurize the base and stack packages 110 and 120 when the upper case 165 is fixed to the lower case 163. The second package connection portion 180 may comprise the connection terminals, similarly to the first package connection portion 170. However, the second package connection portion 180 may electrically contact the input and output pads 116 and 115 of the base package 110 and/or the input and output leads 123 and 124 of the stack package 120. Thus, the second package connection portion 180 may comprise pad connection terminals 182 that may be electrically connected to the input and output pads 116 and 115 of the base package 110 and/or lead connection terminals 181 that may be electrically connected to the input and output leads 123 and 124 of the stack package 120. The second package connection portion 180 may comprise electrical lines that may electrically connect a plurality of pad connection terminals 182 to a plurality of lead connection terminals 181. The electrical line may be selected in consideration of an operational speed of the semiconductor device, and/or the micro-strip line may be used as the electrical line in case of a high speed semiconductor device.

When the base package 110 and/or the stack package 120 may be inserted into the stack-type semiconductor package socket of example embodiments as shown in FIGS. 5B and/or 5C, the base package 110 may be electrically connected to the PCB 150 and/or also may be electrically connected to the stack package 120 by the second package connection portion 180, so that the base package 110 and the stack package 120 become a similar state to the stacked state.

As a result, the whole stack-type semiconductor package may be tested under a similar environment to the stacked state without stacking and/or fixing the individual packages 110 and 120 of the stack-type semiconductor package. Also, since various signals may be inputted and/or outputted through the second package connection portion 180 as well as the first package connection portion 170, the test for the whole stack-type semiconductor package and/or the test for the individual packages 110 and 120 may be simultaneously conducted, and it may be easy to detect defective package(s).

Figure 6B:
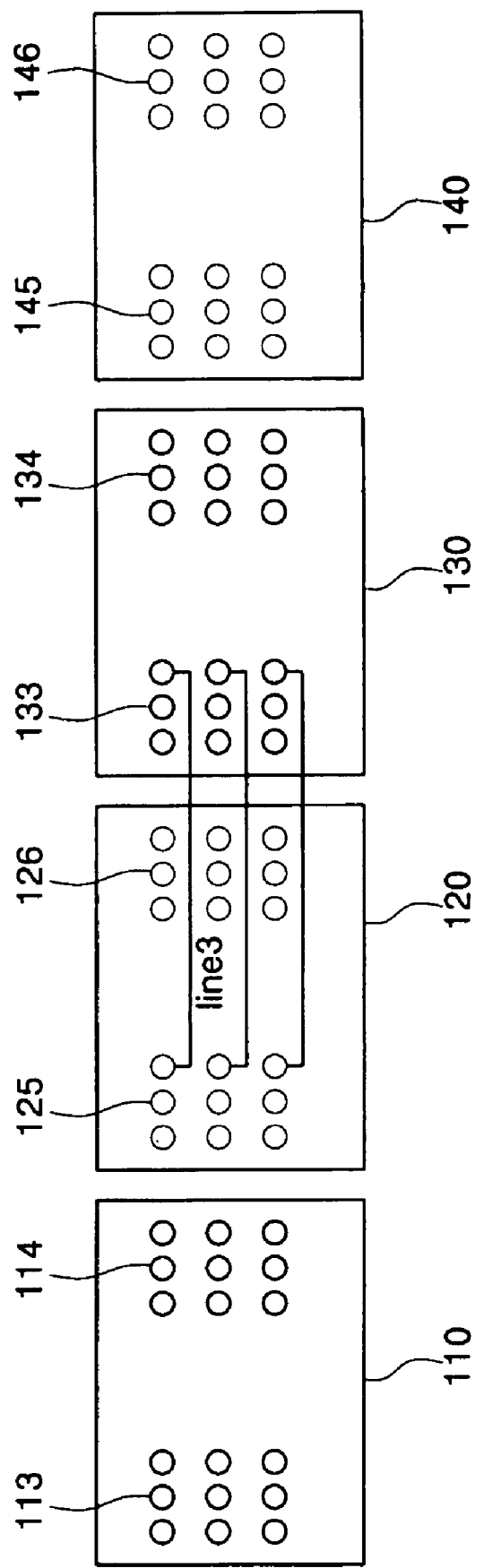
Figure 6C:
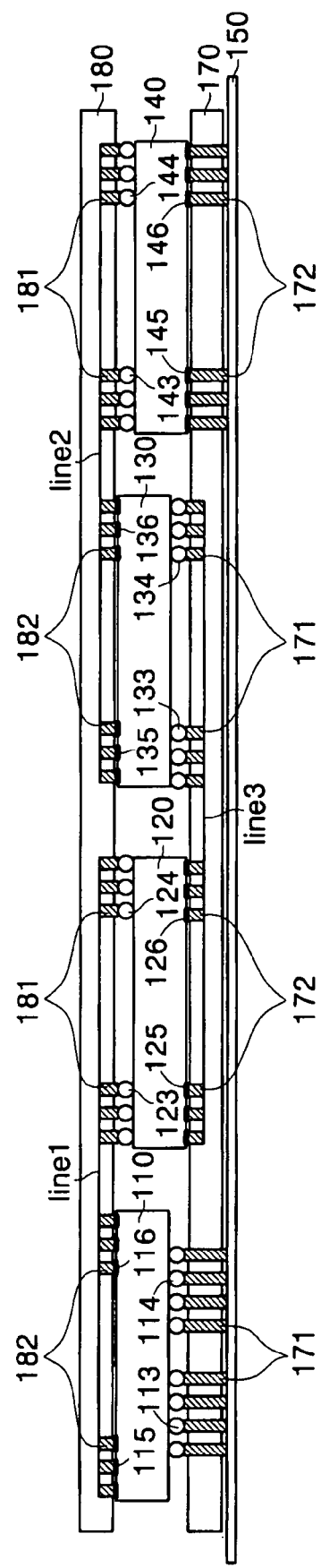
FIG. 6C is a cross-sectional view illustrating individual packages inserted into the socket.

FIGS. 6A and 6B show a four-unit stack-type semiconductor package according to example embodiments. FIG. 6A is a top view illustrating individual packages 110 to 140 arranged, and FIG. 6B is a bottom view illustrating the individual packages arranged. FIG. 6C is a cross-sectional view illustrating the individual packages 110 to 140 inserted into the socket.

Referring to FIGS. 6A to 6C, in the base package 110 and/or the stack package 130, the input and output pads 116, 115, 136 and/or 135 may be arranged to look upwards, and the input and output leads 113, 114, 133, and/or 134 may be arranged to look downwards. In the stack packages 120 and 140, the input and output leads 123, 124, 143, and/or 144 may be arranged to look upwards, and the input and output pads 126, 125, 146, and/or 145 may be arranged to look downwards. That is, the individual packages alternately may have an overturned arrangement. The lead connection terminals 171 of the first package connection portion 170 may be electrically connected to the input and output leads 113 and 114 of the base package 110 and/or the input and output leads 133 and 134 of the stack package 130 and/or the pad connection terminals 172 may be electrically connected to the input and output pads 126 and 125 of the stack package 120 and/or the input and output pads 146 and 145 of the stack package 140. The lead connection terminals 181 of the second package connection portion 180 may be electrically connected to the input and output leads 123 and 124 of the stack package 120 and/or the input and output leads 143 and 144 of the stack package 140, and the pad connection terminals 182 may be electrically connected to the input and output pads 116 and 115 of the base package 110 and/or the input and output pads 136 and 135 of the stack package 130.

The first package connection portion 170 may electrically connect a plurality of pad connection terminals 172 for the stack package 120 to a plurality of lead connection terminals 171 for the stack package 130 using an electrical line line3. Thus, the stack package 120 and the stack package 130 may be connected by the electrical line line3, so that the similar environment to the stacked state is given.

The second package connection portion 180 may electrically connect a plurality of pad connection terminals 182 for the base package 110 to a plurality of lead connection terminals 181 for the stack package 120 using an electrical line line1, and may electrically connect a plurality of pad connection terminals 182 for the stack package 130 to a plurality of lead connection terminals 181 for the stack package 140 using the electrical line line2. Thus, the base package 110 and the stack package 120 may be connected by the electrical line line1 and/or the stack package 130 and the stack package 140 may be connected by the electrical line line2, so that the similar environment to the stacked state is given.

The base package 110 may be electrically connected to the PCB 150 via the lead connection terminals 171 of the first package connection portion 170 to receive and/or output various signals.

As a result, even though the base package 110 and the stack packages 120 to 140 may not actually be stacked, they may become a similar state to the stacked state. Accordingly, the test may be performed under the similar environment to the stacked state without stacking the individual packages 110 to 140 of the stack-type semiconductor package, leading to accurate testing result. In addition, since the first and second package connection portions 170 and 180 may be electrically connected to the individual packages 110 to 140, the individual packages 110 to 140 may be individually tested, and the defective package may be easily detected by checking signals of the electrical lines line1, line2, and/or line3.

Example embodiments have been described focusing on the 4-unit stack-type semiconductor package, but example embodiments may be applied to five or more-unit stack-type semiconductor package, as well.

As described above, the stack-type semiconductor package socket and/or the stack-type semiconductor package test system thereof may provide a similar environment to the stacked state without stacking the individual packages of the stack-type semiconductor package by alternately turning over the individual packages that may not be stacked and/or connecting the pads of the front-unit package to the leads of the next-unit package via the electrical line(s) in the first and second package connection portions. Thus, it may be possible not only to test the whole stack-type semiconductor package, but also to individually test the individual packages, so that it may be easy to detect defective package(s). In addition, since the individual packages are not stacked, it may be easy to repair the stack-type semiconductor package.

While example embodiments have been particularly shown and described, it will be understood by those of ordinary skill in the art that various changes in form and details may be made therein without departing from the spirit and scope of the present invention as defined by the following claims.

What is claimed is:

1. A stack-type semiconductor package socket, comprising:
   a first package connection portion for connection with a plurality of leads of a lowermost package of a stack-type semiconductor package;
   a second package connection portion for connection between a plurality of pads of an odd-numbered package and a plurality of leads of an even-numbered package, wherein the odd-numbered package and the even-numbered package are adjacent to each other;
   a lower case for fixing the first package connection portion; and
   an upper case for fixing the second package connection portion.

2. The socket of claim 1, wherein the first package connection portion comprises:
   a plurality of first lead connection terminals electrically connected to the plurality of leads of the odd-numbered package; and
   a plurality of first pad connection terminals electrically connected to the plurality of pads of the even-numbered package.

3. The socket of claim 2, wherein the first package connection portion further comprises:
   a plurality of first electrical lines that electrically connect the plurality of first pad connection terminals for the even-numbered package to the plurality of first lead connection terminals for the odd-numbered package when three or more packages are provided;
   wherein the odd-numbered package and the even-numbered package are adjacent to each other and are not the lowermost package.

4. The socket of claim 3, wherein the plurality of first electrical lines are micro-strip lines.

5. The socket of claim 2, wherein the plurality of first lead connection terminals are electrically connected to an external printed circuit board (PCB) when the plurality of first lead connection terminals are for the lowermost package.

6. The socket of claim 2, wherein the first package connection portion electrically connects the plurality of first pad connection terminals for an uppermost package to an external printed circuit board (PCB) when the uppermost package is the even-numbered package.

7. The socket of claim 2, wherein the first package connection portion comprises the plurality of first pad connection terminals for even-numbered packages, except an uppermost package, when the uppermost package is an even-numbered package.

8. The socket of claim 2, wherein the first lead connection terminals comprise:
   one or more pogo pins;
   one or more pressure conductive rubber (PCR) terminals; or
   one or more pogo pins and one or more PCR terminals.

9. The socket of claim 1, wherein the second package connection portion comprises:
   a plurality of second pad connection terminals electrically connected to a plurality of pads of the odd-numbered package;
   a plurality of second lead connection terminals electrically connected to a plurality of leads of the even-numbered package; and
   a plurality of second electrical lines for electrically connecting the plurality of second pad connection terminals to the plurality of second lead connection terminals.

10. The socket of claim 9, wherein the second package connection portion comprises the plurality of second pad connection terminals for odd-numbered packages, except an uppermost package, when the uppermost package is an odd-numbered package.

11. The socket of claim 9, wherein the plurality of second electrical lines are micro-strip lines.

12. The socket of claim 9, wherein the second lead connection terminals comprise:
   one or more pogo pins;
   one or more pressure conductive rubber (PCR) terminals; or
   one or more pogo pins and one or more PCR terminals.

13. The socket of claim 1, further comprising:
   a socket fixing means for fixing the lower case to an external printed circuit board (PCB).

14. The socket of claim 1, further comprising:
   a case fixing means for coupling and fixing the upper case to the lower case.

15. A stack-type semiconductor package test system, comprising:
   a stack-type semiconductor package socket that includes:
      a first package connection portion for connection with a plurality of leads of a lowermost package of a stack-type semiconductor package; and
      a second package connection portion for connection between a plurality of pads of an odd-numbered package and a plurality of leads of an even-numbered package, wherein the odd-numbered package and the even-numbered package are adjacent to each other;
   a printed circuit board (PCB) electrically connected to the plurality of leads of the lowermost package through the first package connection portion; and
   a test controller for receiving, outputting, or receiving and outputting various signals from, to, or from and to the stack-type semiconductor package through the PCB and the stack-type semiconductor package socket in order to test the stack-type semiconductor package.

16. The test system of claim 15, wherein the first package connection portion comprises:

a plurality of third lead connection terminals electrically connected to a plurality of leads of the odd-numbered package; and a plurality of third pad connection terminals electrically connected to a plurality of pads of the even-numbered package.

17. The test system of claim 16, wherein the first package connection portion further comprises:

a plurality of third electrical lines that electrically connect the plurality of third pad connection terminals for the even-numbered package to the plurality of third lead connection terminals for the odd-numbered package when three or more packages are provided;

wherein the odd-numbered package and the even-numbered package are adjacent to each other and are not the lowermost package.

18. The test system of claim 16, wherein the plurality of third lead connection terminals are electrically connected to an external printed circuit board (PCB) when the plurality of third lead connection terminals are for the lowermost package.

19. The test system of claim 16, wherein the first package connection portion electrically connects the plurality of third pad connection terminals for an uppermost package to an external printed circuit board (PCB) when the uppermost package is the even-numbered package.

20. The test system of claim 15, wherein the second package connection portion comprises:

a plurality of fourth pad connection terminals electrically connected to the plurality of pads of the odd-numbered package;

a plurality of fourth lead connection terminals electrically connected to the plurality of leads of the even-numbered package; and a plurality of fourth electrical lines for electrically connecting the plurality of fourth pad connection terminals to the plurality of fourth lead connection terminals.

21. The test system of claim 15, wherein the stack-type semiconductor package socket further comprises:

a lower case for fixing the first package connection portion to the PCB;

an upper case for fixing the second package connection portion;

a socket fixing means for fixing the lower case to the PCB; and a case fixing means for fixing the upper case to the lower case.

22. The test system of claim 15, wherein the stack-type semiconductor package socket further comprises:

a case for fixing the first package connection portion to the PCB; and a socket fixing means for fixing the case to the PCB.

23. The test system of claim 22, further comprising:

a handler for fixing the second package connection portion and the stack-type semiconductor package in order to insert the stack-type semiconductor package into the case.

* * * * *